United States Patent [19]
Ganapol et al.

[11] Patent Number: 5,537,031
[45] Date of Patent: Jul. 16, 1996

[54] INTEGRATED CIRCUIT TEST JIG

[75] Inventors: David L. Ganapol, Scotts Valley, Calif.; Arno G. Marcuse, Chandler, Ariz.

[73] Assignee: VLSI Technology, Inc., San Jose, Calif.

[21] Appl. No.: 486,405

[22] Filed: Jun. 5, 1995

Related U.S. Application Data

[63] Continuation of Ser. No. 991,917, Dec. 17, 1992, abandoned.

[51] Int. Cl.$^6$ .............................. H05F 3/02; G01R 31/02
[52] U.S. Cl. ...................... 324/158.1; 361/212
[58] Field of Search .............................. 324/158.1, 72.5; 361/212; 439/70, 68, 526, 912

[56] References Cited

U.S. PATENT DOCUMENTS

| | | | |
|---|---|---|---|
| 4,404,615 | 9/1983 | Dep | 361/212 |
| 4,598,965 | 7/1986 | Briscaud et al. | 339/75 MP |
| 5,002,495 | 3/1991 | Masanori | 439/108 |
| 5,124,637 | 6/1992 | Frisbie | 324/158 F |
| 5,143,450 | 9/1992 | Smith et al. | 374/12 |
| 5,156,649 | 10/1992 | Compton et al. | 439/68 |

FOREIGN PATENT DOCUMENTS

| | | | |
|---|---|---|---|
| 0395951 | 3/1989 | European Pat. Off. | 1/4 |
| 0458448A3 | 11/1991 | European Pat. Off. | 31/28 |

OTHER PUBLICATIONS

"Electronics Test," Test & Measurement World, Mar. 1990, vol. 11, No. 4, p. 52.
Roblee, Jim, "Mechanical Challenges of IC Handler Contactor Designs", Test & Measurement World, Mar. 1990, vol. 11, No. 4, pp. 50,52.

*Primary Examiner*—Kenneth A. Wieder
*Assistant Examiner*—Barry C. Bowser
*Attorney, Agent, or Firm*—Hickman, Beyer & Weaver

[57] ABSTRACT

Test jig apparatus for testing an integrated circuit chip that suppresses build-up and subsequent discharge of electrical charge on the test jig apparatus or on the chip. The test jig apparatus includes a base of selected material having a top surface of the same general shape and dimensions as the chip to be tested. Preferably, the entire top surface of the base is electrically grounded. The base has two or more side surfaces with side surface planes that are approximately perpendicular to a plane defining the top surface of the base. Each side surface accepts a side plate, made of a selected material such as ULTIM, that can be attached to or removed from the base. The side plate material resists electrical charge buildup and subsequent discharge so that the chip being tested is not subjected to electrical discharge from this source. In another embodiment, the side plates are replaced by plates mounted on the top surface of the base.

17 Claims, 4 Drawing Sheets

INTEGRATED CIRCUIT TEST JIG

This is a continuation of application Ser. No. 07/991,917, filed Dec. 17, 1992, now abandoned.

BACKGROUND OF THE INVENTION

This invention relates to integrated circuit chip testing, and more particularly to a test jig apparatus for holding and aligning an integrated circuit chip.

After an integrated circuit (IC) is fabricated, the IC may be tested to determine whether the IC is functional and whether it operates within product specifications. A test jig apparatus is typically provided to receive and align the IC for testing purposes. The IC leads can be pressed against test pads connected to a circuit tester, using a workpress that reciprocatingly urges the IC leads and the test pads together.

As the workpress moves back and forth, an electrostatic charge can develop within the test jig apparatus. If this electric charge flows through the IC by electrostatic discharge (ESD), the resulting current can physically damage the IC held by the test jig apparatus. For example, ESD from accumulated charge on an IC test jig workpress can discharge several microcoulombs (equivalent to more than $10^{13}$ free electrons) on an adjacent IC chip, thus destroying or disabling the chip. The problem of ESD appears to worsen for operation at higher temperatures, e.g. $T \geq 125°$ C.

FIG. 1 illustrates operation of a test jig apparatus 11 from the prior art. The test jig apparatus 11 is of a one-piece construction, including a base 13 with a central aperture 15 (optional) therein, the base 13 having a substantially rectangular top surface 14 with approximately the same shape and planar dimensions as an IC chip 21 to be tested. The test jig apparatus 11 also has four side flanges 17A, 17B, 17C and 17D rigidly extending from the base 13 to form a "cup" to receive and hold the IC chip 21 for testing. The base 13 and four side flanges 17A, 17B, 17C and 17D together form a one-piece construction and are made of a non-electrically conductive material such as VESPULE. An IC chip 21 is received by this "cup" and is further aligned so that the IC leads 23 mate with test pads (not shown) connected to electronic equipment (not shown) that will be used to test the IC chip.

Because the material from which the base and side flanges is made is electrically non-conductive, static charge that accumulates on test jig 11 may discharge through the IC chip being tested in the test jig apparatus. This can damage or destroy the IC chip. Furthermore, accumulated electrical charge on the test jig apparatus 11 may destroy or damage the test jig apparatus itself, requiring that the entire test jig apparatus be replaced.

What is needed is a test jig apparatus that: (1) can operate reliably over a long term at temperatures exceeding 125° C.; (2) allows replacement of damaged portions of the test jig apparatus without requiting replacement of the entire test jig apparatus; and (3) resists electric charge build-up and subsequent electrostatic discharge during operation of the apparatus.

SUMMARY OF THE INVENTION

These needs are met by apparatus that provides a base of electrically conducting material and four removable non-conductive side plates which cooperate with the base to receive an IC chip for testing. The conductive base drains electrostatic charges from the jig apparatus, and the side plates hold the IC and its leads in position for testing. If, over time, the side plates wear or become defective, they can be replaced without removing the entire test jig apparatus.

The combination of the electrically conductive base material and the removable plates provides a configuration that has an improved lifetime (estimated to be 50,000 chip testing sequences or more), sharply reduced test jig apparatus cost, and reduced likelihood of build-up of electrostatic charge.

These and other advantages of the present invention will become apparent to those skilled in the art upon a reading of the following specification of the invention and a study of the several figures of the drawings.

DETAILED DESCRIPTION OF THE PREFERRED EMBODIMENTS

Figure 1:
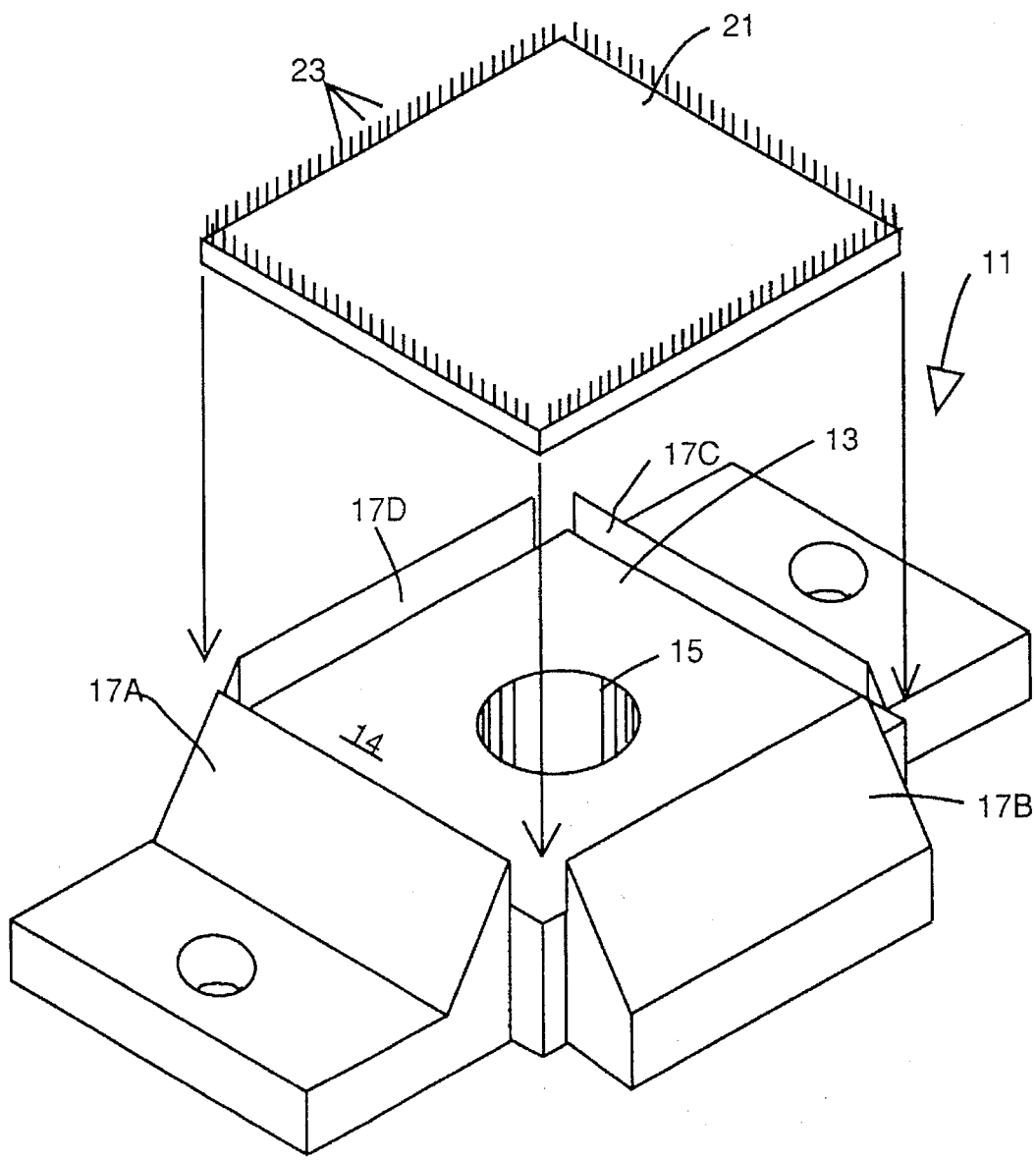
FIG. 1 is a perspective view of a test jig apparatus of the prior art.

FIG. 1 illustrates prior art test jig apparatus which was discussed in the Background Section, above.

Figure 2:
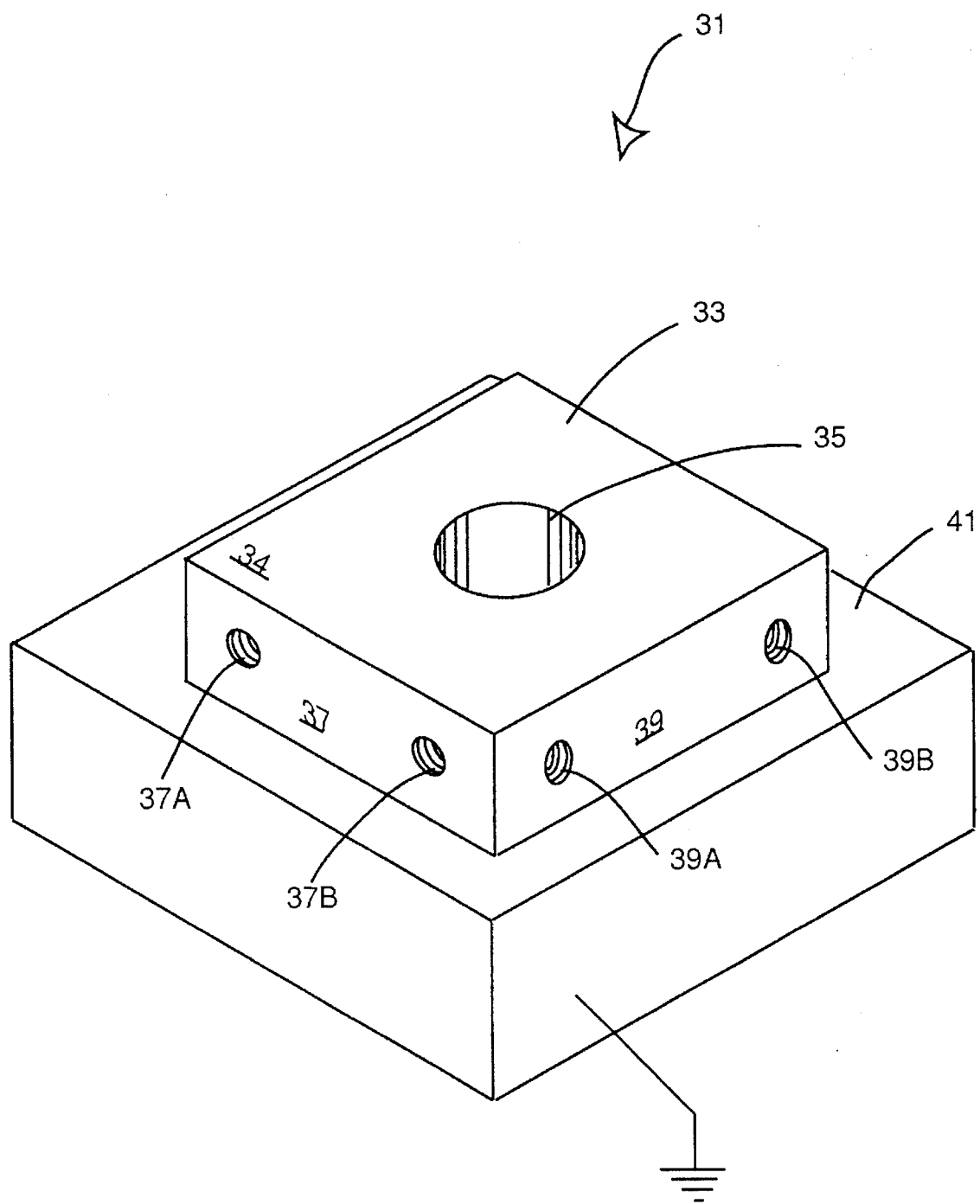
FIGS. 2 and 3 are perspective views of a test jig apparatus constructed according to the present invention, without and with the ESD-resistive side plates attached.

FIG. 2 illustrates an embodiment 31 of a test jig apparatus of the present invention. An electrically grounded base 33 of electrically conductive material, such as aluminum or steel, is provided to hold an IC chip on its top surface 34. The top surface 34 preferably has approximately the same shape and dimensions as the IC chip that will be received by that surface for alignment and testing. Optionally, the base 33 may have an aperture 35 therein to facilitate placement of the IC chip on, and removal of the IC chip from, the top surface 34, e.g. by extending a pin through the aperture 35 to engage an IC. The base 33 is preferably a rectangular parallelepiped having four side surfaces, such as 37 and 39, that are oriented approximately perpendicularly to the top surface 34 of the base 33. Each side surface preferably has two or more threaded bores, such as threaded bores 37A, 37B, 39A, and 39B. Optionally, the base 33 may be coupled to another larger block 41 of material that is also electrically conductive, or stability or weight or electrical grounding or some other test-related reason.

Figure 3:
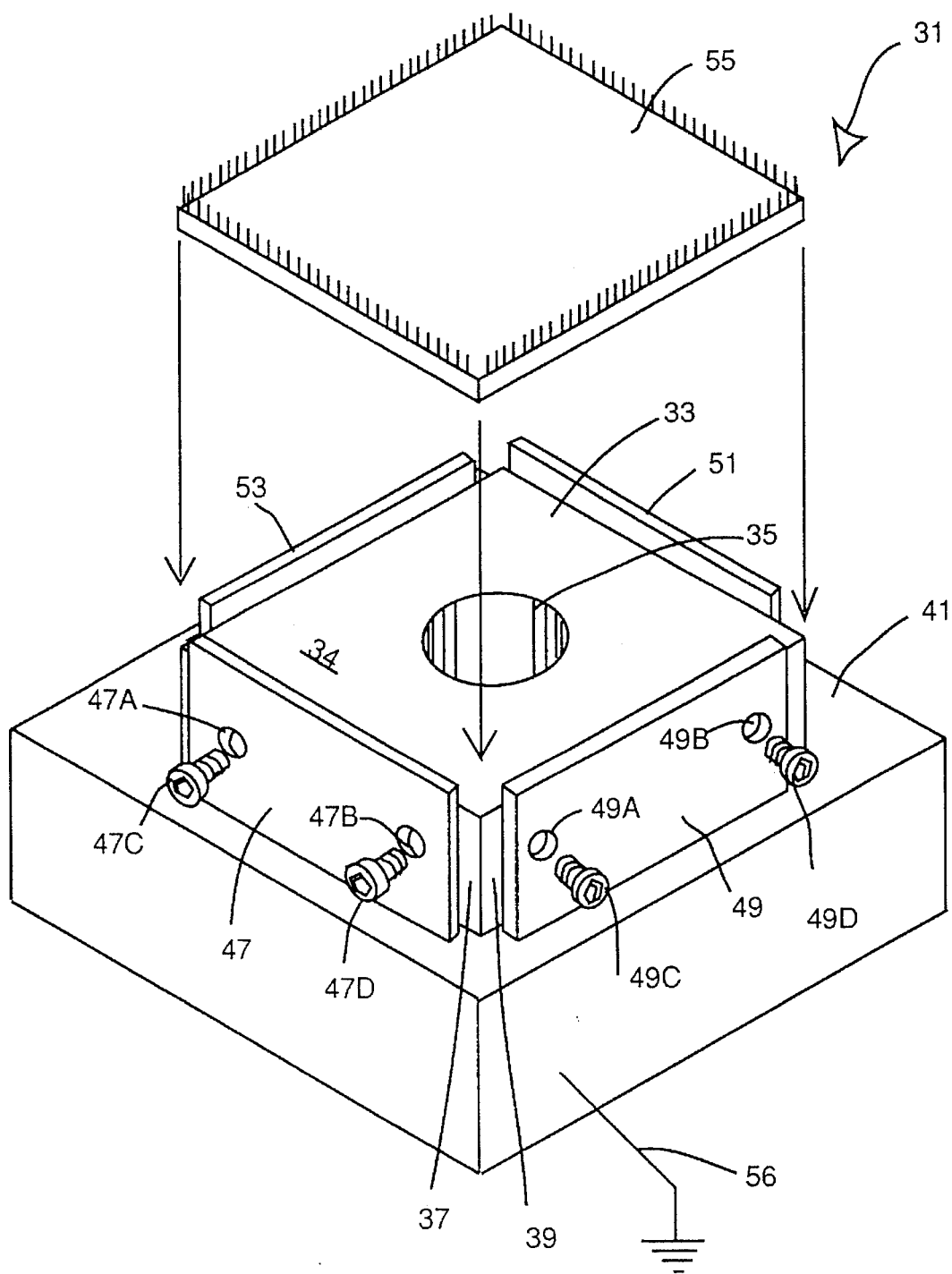

FIG. 3 illustrates the test jig apparatus 31 of FIG. 2 with side plates 47, 49, 51 and 53 attached to the base 33. Each of the side plates 47, 49, 51 and 53 extends above the top surface 34 of the base so that these plates, in combination with the top surface 34, form a "cup" to receive and hold an IC chip 55 to be tested. As illustrated in FIG. 3, the side plates have apertures (e.g. apertures 47A, 47B, 49A, and 49B) which align with the threaded bores 37A, 37B, 39A, and 39B, respectively of the base 33. Each of the apertures 47A, 47B, 49A and 49B receives a screw or other attachment means 47C, 47D, 49C, and 49D, respectively, that attaches the side plate 47 or 49, as the case may be, to the corresponding side surface of the base 33. Similar apertures and screws or attachments means (not shown) are provided for the side plates 51 and 53, for the same purpose.

The side plates 47, 49, 51, and 53 are preferably made of a selected material, such as ULTIM, that resists charge buildup and subsequent ESD. An electric charge that would otherwise accumulate on the base 33 can be conducted through the base 33 to ground by a line 56 or other discharge means. The material for the side plates 47, 49, 51, and 53 is electrically non-conductive so that the IC chip leads and the circuit testing pads are not shorted together if these leads or pads make contact with a side plate. Operated in this manner, the embodiment 31 resists the accumulation of electrical charge. Thus, the test jig apparatus shown in FIG. 3 is subjected to reduced ESD damage and may be used for an estimated 50,000 or more IC chip processings. The base 33 should last a much longer time. Further, when one or more of the side plates 47, 49, 51, and 53 no longer functions as required, that side plate may be replaced with a new or reconditioned side plate without replacing the entire test jig apparatus.

Figure 4:
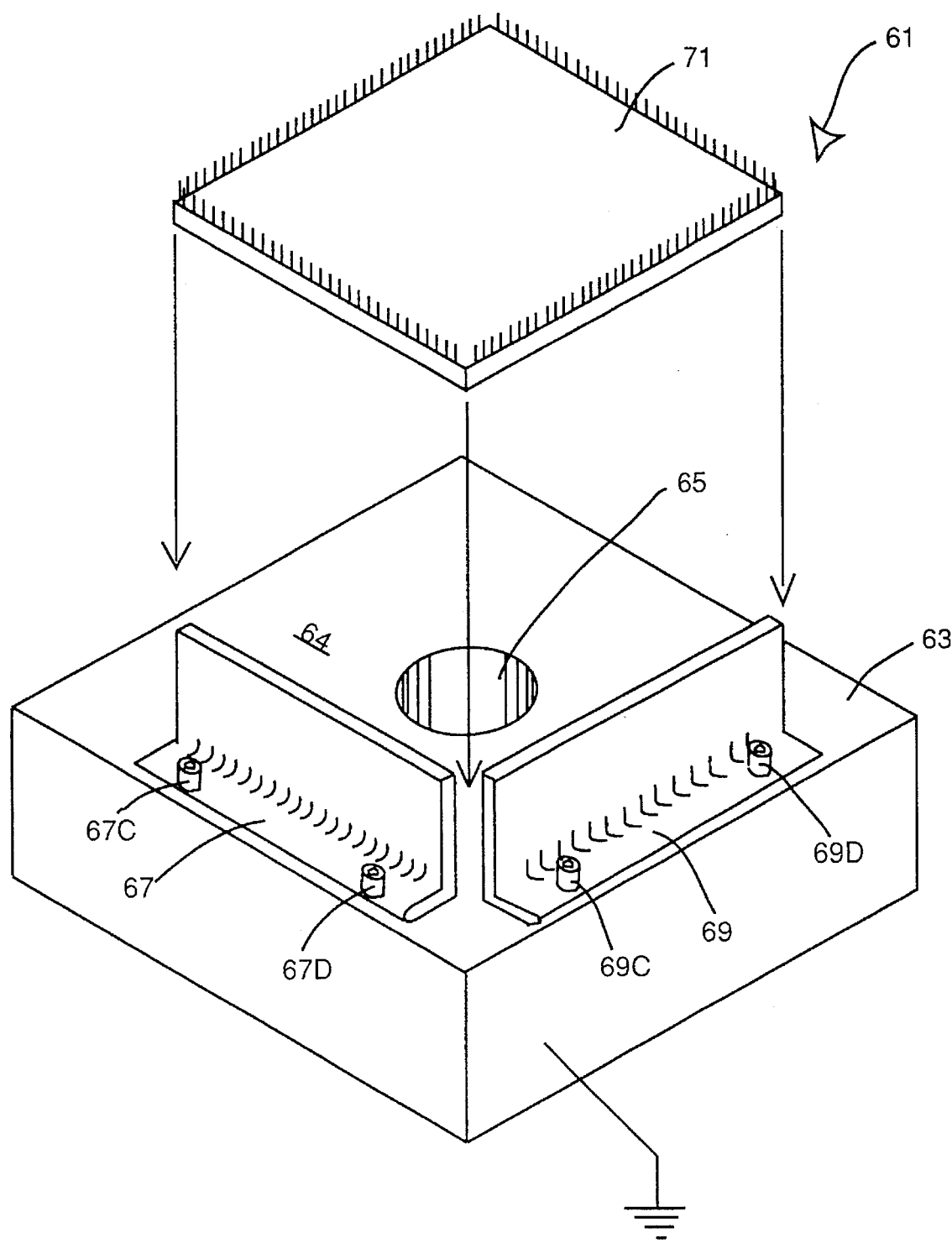
FIG. 4 is a perspective view of another embodiment of the present invention.

FIG. 4 illustrates a second embodiment 61 of the invention, in which a grounded base 63 of electrically conducting material has two or more side plates 67 and 69 attached to a top surface 64 of the base adjacent to each other. The side plates 67 and 69 are made of an ESD-resistant material, such as ULTIM, and are attached to the top surface 64 of the base 63 by screws or other attachment means 67C, 67D, 69C, 69D as shown. Optionally, the base 63 has an aperture 65 therein to facilitate placement of the IC chip 71 in, or removal of the chip from, the test jig apparatus 61, as described previously.

A test jig, constructed according to the invention, can operate at temperatures T=125°–150° C. The electrical conductivity of the material used for the base 33 may decrease slightly with increasing temperature, but any accumulated electrical charge can still be safely conducted to ground. The material, such as ULTIM, from which the side plates in FIG. 3 or the side plates in FIG. 4 are made, has been tested and found to perform well at these operating temperatures.

Although the preceding discussion has assumed that the entire base (33 in FIGS. 2 and 3, 63 in FIG. 4) is electrically conductive, it is sufficient if merely a portion of the top surface of this base be electrically conductive, such that it provides an electrical path to safely discharge the electrical charge that may accumulate on the base or its top surface.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. Test and alignment jig apparatus for an integrated circuit chip, the apparatus comprising:

a base of selected material, having a top surface with a defining top surface plane having a shape and dimensions that are approximately the same as the shape and dimensions of a top surface of an integrated circuit chip to be tested, and having at least two substantially planar side surfaces with defining side surface planes that are approximately perpendicular to the defining top surface plane, where at least a portion of the top surface of the base is electrically conductive and adapted to contact a portion of a package of an integrated circuit chip engaged with said top surface; and at least two plates of a selected electrically non-conductive material adapted to laterally retain said integrated circuit chip without electrically shorting leads of said integrated circuit chip, each plate extending above the top surface of the base and being removably attached to one of the plurality of side surfaces, where the plurality of plates plus the top surface of the base defines a test area that receives the integrated circuit chip thereon.

2. The apparatus of claim 1, wherein said selected non-conductive material resists electrostatic discharge.

3. The apparatus of claim 2, where the selected non-conductive material comprises ULTIM.

4. The apparatus of claim 1, wherein said electrically conductive portion of said top surface of said base is electrically grounded.

5. The apparatus of claim 1, wherein substantially all of said base is electrically conductive.

6. The apparatus of claim 1, wherein said base has an aperture opening on said top surface.

7. Test and alignment jig apparatus for an integrated circuit chip, the apparatus comprising:

a base having a top surface receptive to a top surface of the integrated circuit chip, where at least a portion of the top surface of the base is electrically conductive and is configured to engage a surface of said integrated circuit chip; and a plurality of non-conductive plates, each plate being removably coupled to said base and extending above the top surface of the base, the plates being positioned proximate to each other to define a test area on the top surface of the base that receives the integrated circuit chip thereon, said non-conductive plates preventing the shorting of leads of said integrated circuit chip.

8. The apparatus of claim 7, wherein said non-conductive plates resist electrostatic discharge.

9. The apparatus of claim 8, where said non-conductive plates are formed of a selected material comprising ULTIM.

10. The apparatus of claim 7, wherein said electrically conductive portion of said top surface of said base is electrically grounded.

11. The apparatus of claim 7, wherein substantially all of said base is electrically conductive.

12. A method for testing an integrated circuit chip, the method comprising the steps of:

providing a base of a selected material having a top surface, where at least a portion of the top surface of the base is electrically conductive;

attaching to the base, proximate the top surface thereof, at least two plates of electrically non-conductive material, each plate extending above the top surface of the base, where the plates and the top surface of the base define a test area that receives an integrated circuit chip;

positioning an integrated circuit chip in the test area; and performing at least one electrical test on the chip while the chip is positioned in the test area.

13. The method of claim 12, further comprising the step of electrically grounding said electrically conductive portion of said top surface of said base.

14. A method for making an integrated circuit chip comprising:

manufacturing a packaged integrated circuit chip having a plurality of leads;

positioning said integrated circuit chip in a test area of a base of a selected material having a top surface, where at least a portion of the top surface of said base is electrically conductive and engages said integrated circuit chip, said integrated circuit chip also engaging at least two plates of an electrically non-conductive material, each plate extending above the top surface of said base;

electrically coupling leads of said integrated circuit chip to a tester; and performing at least one electrical test on the chip with said tester while the chip is positioned in the test area.

15. The method of claim 14 further comprising the step of electrically grounding said electrically conductive portion of said top surface of said base.

16. The method as recited in claim 15, the plates are removably attached to the base and extend above the top surface of the base.

17. The method as recited in claim 13, the plates are removably attached to the base and extend above the top surface of the base.

* * * * *